United States Patent
Södö et al.

(10) Patent No.: US 11,837,964 B2
(45) Date of Patent: Dec. 5, 2023

(54) METHOD FOR DETECTING LOW IMPEDANCE CONDITION AT OUTPUT OF ELECTRICAL CONVERTER, CONTROL UNIT, COMPUTER PROGRAM PRODUCT AND ELECTRICAL CONVERTER

(71) Applicant: Danfoss Power Electronics A/S, Gråsten (DK)

(72) Inventors: Nicklas Södö, Nordborg (DK); Juha Norrena, Nordborg (DK)

(73) Assignee: DANFOSS POWER ELECTRONICS A/S, Grasten (DK)

( * ) Notice: Subject to any disclaimer, the term of this patent is extended or adjusted under 35 U.S.C. 154(b) by 242 days.

(21) Appl. No.: 17/282,841

(22) PCT Filed: Apr. 10, 2019

(86) PCT No.: PCT/EP2019/059061
§ 371 (c)(1),
(2) Date: Apr. 5, 2021

(87) PCT Pub. No.: WO2020/207575
PCT Pub. Date: Oct. 15, 2020

(65) Prior Publication Data
US 2021/0351701 A1   Nov. 11, 2021

(51) Int. Cl.
*H02M 5/458* (2006.01)
*H02M 1/32* (2007.01)
(Continued)

(52) U.S. Cl.
CPC ............. *H02M 5/458* (2013.01); *H02M 1/32* (2013.01); *H02M 1/36* (2013.01); *G01R 1/42* (2013.01)

(58) Field of Classification Search
CPC .. H02M 7/5375; H02M 7/537; H02M 7/5387; H02M 5/45; H02M 5/451;
(Continued)

(56) References Cited

U.S. PATENT DOCUMENTS

| | | | |
|---|---|---|---|
| 2002/0000784 A1* | 1/2002 | Shamoto | H02P 6/10 318/801 |
| 2005/0099743 A1* | 5/2005 | Lee | H02H 3/165 361/42 |

(Continued)

FOREIGN PATENT DOCUMENTS

| | | |
|---|---|---|
| CN | 101917116 A | 12/2010 |
| CN | 104396134 A | 3/2015 |

(Continued)

OTHER PUBLICATIONS

International Search Report for PCT Serial No. PCT/EP2019/059061 dated Jan. 3, 2020.
(Continued)

*Primary Examiner* — Gustavo A Rosario-Benitez
(74) *Attorney, Agent, or Firm* — McCormick, Paulding & Huber PLLC (57) ABSTRACT

A method for detecting low impedance condition at an output (15) of an electrical converter (10), a control unit (1000), a computer program product, and an electrical converter (10) are presented. The method includes determining (110) a first current value (I1(T1)) of a first current (I1), and a second current value (I1(T2)) of the first current (I1), and determining (120) a first current difference (ΔI1) between the first (I1(T1)) and the second (I1(T2)) current values, and comparing (130) the first current difference (ΔI1) to a first current difference threshold (I1_TH), and if the first current difference (ΔI1) is of predefined magnitude with respect to the first current difference threshold (I1_TH), such as higher, turning off (140) a first voltage (U1) driving the
(Continued)

first current (I1), such as by switching off a corresponding switch or switches for applying the first voltage (U1) to the output (15).

24 Claims, 5 Drawing Sheets (51) Int. Cl.
 *H02M 1/36* (2007.01)
 *G01R 31/42* (2006.01)
 *G01R 1/42* (2006.01)

(58) Field of Classification Search
 CPC ...... H02M 5/452; H02M 5/453; H02M 5/458; H02M 1/36; H02M 1/32; G01R 31/42; G01R 31/50; G01R 31/52; H02H 3/08; H02H 3/083; H02H 7/1227; H02H 11/005
 See application file for complete search history.

(56) References Cited

U.S. PATENT DOCUMENTS

| | | | |
|---|---|---|---|
| 2006/0043954 A1* | 3/2006 | Markowski | H02M 3/157 323/283 |
| 2007/0085546 A1 | 4/2007 | Virolainen | |
| 2008/0239764 A1 | 10/2008 | Jacques et al. | |
| 2010/0080022 A1* | 4/2010 | Schmidt | H02M 7/062 363/53 |
| 2011/0249368 A1 | 10/2011 | Andersen | |
| 2011/0270545 A1 | 11/2011 | Doktar et al. | |
| 2013/0057297 A1 | 3/2013 | Cheng et al. | |
| 2013/0094258 A1* | 4/2013 | Royak | H02M 1/32 363/89 |
| 2013/0286522 A1* | 10/2013 | Mullins | H01R 13/665 361/58 |
| 2014/0176027 A1 | 6/2014 | Osaki et al. | |
| 2016/0164278 A1 | 6/2016 | Hayashi | |
| 2018/0191156 A1* | 7/2018 | Long | H02H 9/08 |
| 2019/0113576 A1* | 4/2019 | Saito | H02P 29/0241 |
| 2020/0358354 A1* | 11/2020 | You | H02M 3/158 |

FOREIGN PATENT DOCUMENTS

| | | |
|---|---|---|
| CN | 104716872 A | 6/2015 |
| CN | 105075102 A | 11/2015 |
| CN | 108370218 A | 8/2018 |
| JP | H06245301 A | 9/1994 |
| JP | 2017-127079 A | 7/2017 |
| JP | 2017-175795 A | 9/2017 |

OTHER PUBLICATIONS

First Office Action for Chinese Patent Application No. 201980018890.X, dated Feb. 8, 2023, and its English translation.

* cited by examiner

METHOD FOR DETECTING LOW IMPEDANCE CONDITION AT OUTPUT OF ELECTRICAL CONVERTER, CONTROL UNIT, COMPUTER PROGRAM PRODUCT AND ELECTRICAL CONVERTER

CROSS-REFERENCE TO RELATED APPLICATIONS

This application is a National Stage application of International Patent Application No. PCT/EP2019/059061, filed on Apr. 10, 2019, which is hereby incorporated by reference in its entirety.

TECHNICAL FIELD

The present invention relates in general to electrical converters, such as frequency converters or inverters. In particular, however not exclusively, the present invention concerns controlling the operation of electrical converter for detecting low impedance condition at the output of the converter.

BACKGROUND

There are known solutions for detecting when an electrical converter has a very low output impedance condition, for example, a short-circuit condition. This will cause overcurrent if the low impedance condition persists too long. There are known event-based methods for detecting the low impedance condition, such as by measuring current and having with a certain trip level for stopping the operation of the converter in case of too high current value. Another event-based method is based on desaturation detection of an IGBT (Insulated-Gate Bipolar Transistor) comprised in the converter. This can be done by measuring voltage over the IGBT and stopping the operation in case of a measurement of too high voltage when switching the IGBT to the conductive state.

Still another event-based method is utilizing pulse shifting to make pulses during which the switching device of the converter is in conductive state sufficiently long in order to get an overcurrent trip. However, longer duration of voltage, or longer voltage vectors in some cases, must then be compensated to get the right output voltage. The drawback with the pulse shifting method is the increased audible noise from the motor due to larger current ripple in the motor windings, for instance.

Drawback with the event-based methods is a possible short circuit during start-up of the inverter. At the start-up the inverter can face two different kind of events. One is when the duration of voltage being applied at the output is so short that the peak current remains below the trip level and the voltage over the IGBT will not stay high for long enough time to reliably trip for desaturation and, thus, the low impedance condition, such as short-circuit, stays undetected. Another is when the duration of voltage being applied at the output is long enough to increase the current over the trip level, that is to an overcurrent value. Rapid increase of the current causes delay in the switching off the IGBT which leads to a situation where the current is switched off above the SOA (safe operating area) level of the IGBT.

SUMMARY

An objective of the present invention is to provide a method for detecting low impedance condition at an output of an electrical converter, a control unit, a computer program product, and an electrical converter. Another objective of the present invention is that the method, the control unit, the computer program product, and the electrical converter at least alleviate some of the drawbacks related to the known solutions.

The objectives of the invention are reached by a method, a control unit, a computer program product and an electrical converter as defined by the respective independent claims.

According to a first aspect, a method for detecting a low impedance condition at an output of an electrical converter, such as a frequency converter or an inverter, is provided. The method comprises
  determining a first current value of a first current, such as of a first output phase current of the electrical converter, and a second current value of the first current, and determining a first current difference between the first and the second current values, and
  comparing the first current difference to a first current difference threshold, and if the first current difference is of predefined magnitude with respect to the first current difference threshold, such as higher,
  turning off a first voltage driving the first current, such as by switching off a corresponding switch or switches for applying the first voltage to the output.

In various embodiments, the turning off the first voltage may comprise applying a zero voltage vector in accordance with a vector control method for controlling the output of the electrical converter.

In various embodiments, the method may comprise, after the turning off the first voltage, determining a decay time of the first current, and comparing the decay time to a decay time threshold, and if the decay time is of predefined magnitude with respect to the decay time threshold, such as higher, detecting the low impedance condition.

In various embodiments, the method may comprise, prior to said determining of the first and second current values of the first current, turning on the first current by applying the first voltage for a first time period, wherein said determining comprises determining of the first and second current values of the first current during the first time period.

In some embodiments, the turning on the first current may comprise switching a number of semiconductor switches of the electrical converter by applying for the first time period a first active voltage vector in accordance with a vector control method for controlling the output of the electrical converter.

In various embodiments, the method may comprise predefining a length of the first time period to be shorter than a first active voltage vector time threshold, such as 10 microseconds, and only then performing the other method steps.

Alternatively or in addition, the method may comprise determining the length of the first time period and, if the length is shorter than the first active voltage vector time threshold, such as 10 microseconds, only then performing the other method steps.

In various embodiments, the method may comprise determining the first and the second current values with a first sampling rate, wherein the first sampling rate is 0.5-10 microseconds, that is 100 kHz-2 MHz, preferably 0.75-5 microseconds, that is about 200 kHz-1.33 MHz, and more preferably 1-2 microseconds, that is 500 kHz-1 MHz.

In various embodiments, the method may comprise, after said comparing the first current difference to the first current difference threshold, determining a peak value of the first current, preferably during the first time period.

In various embodiments, the method may comprise, after said comparing the first current difference to the first current difference threshold, determining a third current value of the first current at a third time instance, and said determining the decay time comprises determining a time interval during which the first current reduces to a predetermined portion of the third current value.

In some embodiments, the third current value may the peak value of the first current.

In various embodiments, said determining of the decay time may comprise determining a fourth current value of the first current after a second time interval after the third time instance, and determining a second current difference between the third current value and the fourth current value, and if the second current difference is of predefined magnitude with respect to a second current difference threshold, detecting the low impedance condition.

In various embodiments, the method may comprise substantially simultaneously performing the method steps as described hereinabove with respect to the first current for a second current and a third current. The second current and the third current may be a second output phase current and a third output phase current of the electrical converter, respectively. The method may further comprise comparing at least one of the following to corresponding values of other two phases: the first current differences, the decay times. This may mean, for example, that the first current difference related to the first or the second current may be compared to the first current differences of the second and third currents, or of the first and third currents, respectively.

In various embodiments, the method may comprise performing the method at a start-up of the electrical converter.

According to a second aspect, a control unit is provided. The control unit comprises at least one processor, and at least one memory storing at least one portion of computer program code. The at least one processor is configured to cause the control unit to perform at least the method steps according to the first aspect.

Alternatively or in addition, the at least one processor may be configured to cause the control unit to perform at least the method steps according to any embodiment of the first aspect related to which more details may be described in the detailed description hereinlater.

According to a third aspect, a computer program product is provided. The computer program product may comprise program instructions which when executed by a processor of a control unit cause the control unit to perform the method steps according to the first aspect.

Alternatively or in addition, the computer program product may comprise program instructions which when executed by the processor of the control unit cause the control unit to perform the method steps according to any embodiment of the first aspect related to which more details may be described in the detailed description hereinlater.

According to a fourth aspect, an electrical converter, such as a frequency converter or an inverter, for example, a three-phase converter or inverter, is provided. The electrical converter comprises a number of output phases, such as a first, second and third output phases, and a number of semiconductor switches configured for producing a corresponding number of output phase currents with respect to the number of output phases. The electrical converter further comprises current determining means for determining the number of output phase currents, and a control unit for controlling an operation of the electrical converter. The control unit is configured to perform at least the method steps according to the first aspect. The control unit is communicatively connected, or functionally connected, to said semiconductor switches and said current determining means.

Alternatively or in addition, the control unit of the electrical converter may be configured to perform at least the method steps according to any embodiment of the first aspect related to which more details may be described in the detailed description hereinlater.

The present invention provides a method for detecting a low impedance condition at an output of an electrical converter, a control unit, a computer program product and an electrical converter. The present invention provides advantages over known solutions such that the low impedance condition can be detected without having to operate the switch device(s) of the converter outside SOA region of the switch.

Various other advantages will become clear to a skilled person based on the following detailed description.

The expression "a number of" may herein refer to any positive integer starting from one (1), that is, being at least one.

The expression "a plurality of" may refer to any positive integer starting from two (2), respectively, that is, being at least two.

The terms "first", "second" and "third" are herein used to distinguish one element from other element, and not to specially prioritize or order them, if not otherwise explicitly stated.

The exemplary embodiments presented herein are not to be interpreted to pose limitations to the applicability of the appended claims. The verb "to comprise" is used herein as an open limitation that does not exclude the existence of also un-recited features. The features recited in depending claims are mutually freely combinable unless otherwise explicitly stated.

The novel features which are considered as characteristic of the present invention are set forth in particular in the appended claims. The present invention itself, however, both as to its construction and its method of operation, together with additional objectives and advantages thereof, will be best understood from the following description of specific embodiments when read in connection with the accompanying drawings.

BRIEF DESCRIPTION OF FIGURES

Some embodiments of the invention are illustrated by way of example, and not by way of limitation, in the figures of the accompanying drawings.

DETAILED DESCRIPTION

Figure 1A:
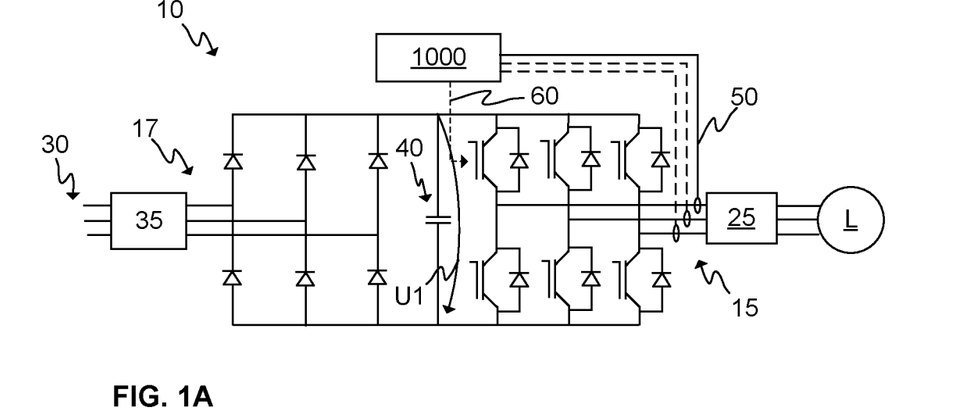
FIGS. 1A-1C illustrate schematically electrical circuits or converters according to some embodiments of the present invention.
Figure 1B:
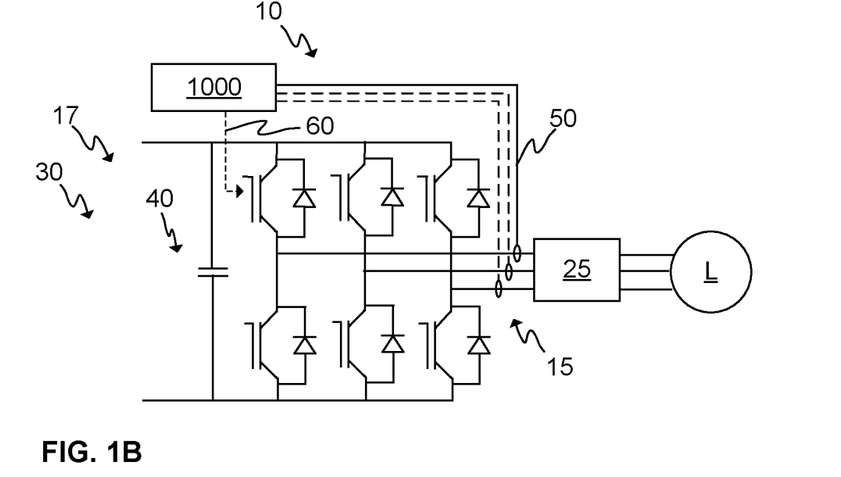
Figure 1C:
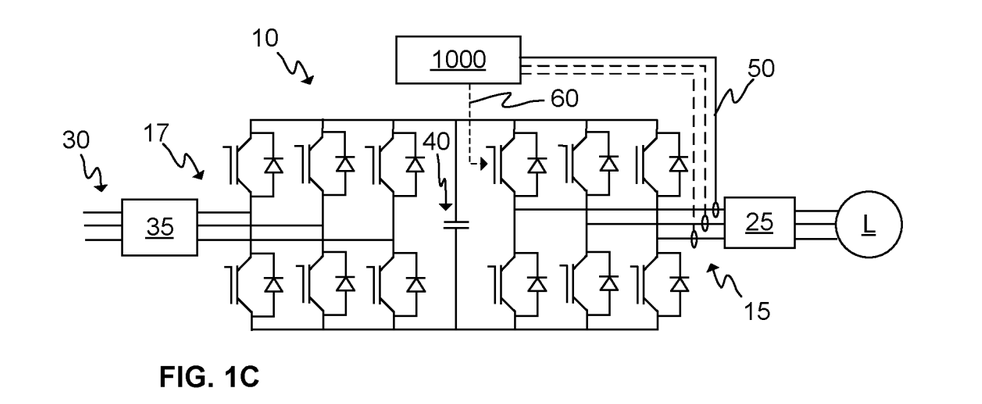

FIGS. 1A-1C illustrate schematically electrical converters 10 according to some embodiments of the present invention.

FIG. 1A illustrates a frequency converter being coupled to an electrical load L, such as a motor, for example, an induction motor. The frequency converter 10 may, preferably, also be connected to electrical grid 30 or other electrical power source 30. In FIG. 1A, the electrical grid 30, for instance, is a three-phase electrical grid 30.

In various embodiments, the converter 10 may comprise current measurement device 50 or devices 50 for measuring current(s) at the output 15 of the converter 10.

The frequency converter may comprise a line side portion, such as a rectifier shown on the left in FIG. 1A and comprising diodes, and a load side portion, such as an inverter as shown on the right in FIG. 1A and comprising controllable semiconductor switches, such as IGBTs or SiC (Silicon Carbide) JFETs (junction gate field-effect transistors). The converter 10 may, preferably, comprise an intermediate circuit energy storage 40 or filter 40, such as a capacitor and/or an inductor.

In some embodiments, there may be further filters, such as a first filter 35 on the electrical grid side of the converter 10 and/or a second filter 25 on the electrical load side of the converter 10. These filters 25, 35 may comprise capacitor(s) and/or inductor(s) connected in suitable manner for producing the desired filtering effect.

The filter(s) 25, 35 may be comprised in the electrical converter 10 or be separate elements relative to the converter 10. For example, currents and/or voltages may be determined, such as by measurements, between the second filter 35 and the electrical grid 30, and utilized as feedback signal for controlling the operation of the converter 10. In another embodiment, currents and/or voltages may be determined, such as by measurements, between the first filter 25 and the electrical load L, and utilized as feedback signal for controlling the operation of the converter 10. In various embodiments, the currents and/or voltages may be determined between the converter 10 and the first 25 or the second 35 filter.

FIG. 1B shows an inverter being coupled to an electrical load L, such as to a motor, for example, an induction motor. The inverter may, preferably, be connected to electrical grid 30 or other electrical power source 30, such as a direct current (DC) power source, for example, a battery. In FIG. 1B, the inverter may comprise semiconductor switches, such as IGBTs or SiC (Silicon Carbide) JFETs (junction gate field-effect transistors). Furthermore, there may be an input capacitor 40 connected to the input 17 of the inverter.

FIG. 1C illustrates another example of a frequency converter according to which the line side portion may also comprise controllable switches, such as IGBTs or SiC JFETs.

According to various embodiments, the converter 10 may comprise a control unit 1000. There may be external unit(s) which may be connected to a communication interface of the control unit 1000. External unit(s) may comprise wireless connection or a connection by a wired manner. The communication interface may provide interface for communication with the external unit(s) such as current 50 and/or voltage measurement devices, or semiconductor switches, or user interfacing devices or the like. There may also be connection to an external system, such as a laptop or a handheld device. There may also be a connection to a database of the converter 10 including information used in controlling the operation of the converter 10.

The control unit 1000 may comprise one or more processors, one or more memories being volatile or non-volatile for storing portions of computer program code and any data values and possibly one or more user interface units. The mentioned elements may be communicatively coupled to each other with e.g. an internal bus.

The processor of the control unit 1000 may at least be configured to implement at least some method steps as described hereinbelow (for example, at least steps 110, 120, 130, 140, and optionally, 150, 160). The implementation of the method may be achieved by arranging the processor to execute at least some portion of computer program code stored in the memory causing the processor, and thus the control unit 1000, to implement one or more method steps as described hereinbelow. The processor may thus be arranged to access the memory and retrieve and store any information therefrom and thereto. For sake of clarity, the processor herein refers to any unit suitable for processing information and control the operation of the control unit 1000 among other tasks. The operations may also be implemented with a microcontroller solution with embedded software. Similarly, the memory is not limited to a certain type of memory only, but any memory type suitable for storing the described pieces of information may be applied in the context of the present invention.

The control unit 1000 may preferably be configured to be in connection 60 with the gate(s) of the semiconductor switch(es) for operating the switch(es). The controlling may, preferably, be based on the pulse width modulation as is known in the art. For example, field-oriented control or space vector modulation may be utilized.

In various embodiments, the converter 10 may comprise various other measurement devices in addition or alternatively to what is shown in FIGS. 1A-IC. These may include current and/or voltage measurement device(s) at the input 17 of the converter 10, current and/or voltage measurement devices in the intermediate circuit of the converter 10, such as voltage measurement across the intermediate circuit capacitor 40. Furthermore, if the electrical load L is a motor, there may be a measurement device for determining the rotational speed of the motor. The rotational speed of the motor may be configured to be obtained or fed into the control unit 1000 for controlling the operation of the motor.

Figure 2:
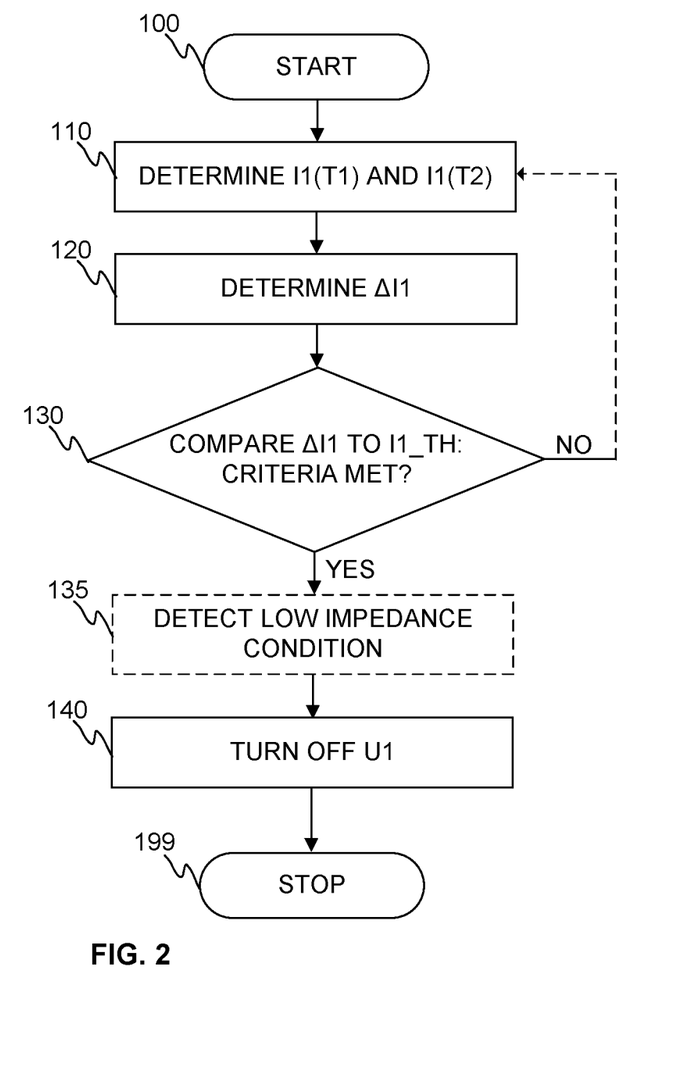
FIG. 2 illustrates a flow diagram of a method according to an embodiment of the present invention.

FIG. 2 illustrates a flow diagram of a method according to an embodiment of the present invention.

Step 100 may refer to a start-up phase of the method. Suitable equipment and components are obtained and systems assembled and configured for operation, such as related to an electrical converter 10, an electrical load L, for example, a motor, and electrical and communication connections therebetween.

Step 110 may refer to determining a first current value I1(T1) of a first current I1, such as of a first output phase current of the electrical converter 10, and to a second current value I1(T2) of the first current I1. In various embodiments, one first I1(T1) and second I1(T2) current values may be determined, or several first I1(T1) and second I1(T2) current values from which then representing values for the first I1(T1) and the second I1(T2) current values may be calculated.

According to an embodiment, the second current I1(T2) value of the first current I1 may be the peak value I1_P of the first current I1. The peak value I1_P may be determined substantially at, or just before, the time instance of turning off the first voltage U1 (step 140). The peak value may refer to positive or negative peak of the current, that is to a local maximum or minimum value. Alternatively or in addition, the first current value I1(T1) may be determined at the start of the period when the first current I1 starts to flow, that is, for example, at the beginning of the period of an active voltage vector. In case of start-up of the converter 10, the first current value I1(T1) may be zero or at least close to zero.

Step 120 may refer to determining a first current difference ΔI1 between the first I1(T1) and the second I1(T2) current values. Alternatively, the first current difference ΔI1 may be determined between the representing values of the first I1(T1) and the second I1(T2) current values. The first current difference ΔI1 may be calculated, for example, by ΔI1=I1(T2)−I1(T1) or by ΔI1=|I1(T1)−I1(T2)|.

In some embodiments, the first current difference ΔI1 may be the total change of the first current during said period of current flowing to the electrical load L, that is between the initial value, for example zero, and the final value, or peak value I1_P, at the end of said period. Said period may, preferably, end when a first voltage U1 driving the first current I1 is turned off (step 140). This may thus mean the period of the active voltage vector. During the start-up of the converter 10, this preferably means the time period of the first active voltage vector.

Step 130 may refer to comparing the first current difference ΔI1 to a first current difference threshold I1_TH. If the criteria, that is the first current difference ΔI1 being of predefined magnitude with respect to the first current difference threshold I1_TH, is not satisfied, the method may be ended. Alternatively, the method may be repeated by determining new first current values I1(T1), I1(T2) as shown in FIG. 2. In an embodiment, the first current difference threshold I1_TH may be a certain level in relation to nominal values of the converter 10, such as k*I_nom, that is some constant k above zero and up to one multiplied by the nominal current I_nom of the converter 10. The criteria may thus be not met, for example, if the absolute value of the first current difference ΔI1 is lower than the first current difference threshold I1_TH.

However, if the first current difference ΔI1 is of predefined magnitude with respect to the first current difference threshold I1_TH, such as higher, that is the criteria is met, it may be concluded, at optional step 135, that there is a low impedance condition at the output 15 of the converter 10. The consequence of performing step 135 may be to shut down the operation of the converter 10 at least partly, such as by stopping the operation of the semiconductor switches by turning off the modulation.

The method may then comprise, at step 140, turning off a first voltage U1 driving the first current I1, such as by switching off a corresponding switch or switches for applying the first voltage U1 to the output 15. However, according to some embodiments, step 140 may be performed prior to or simultaneously with step 130.

The first voltage U1 driving the first current I1 may mean various alternative things. For example, it may mean switching of a single switch, such as a semiconductor switch, which then removes or turns off the first voltage U1 that is causing the first current I1 to flow. Alternatively, it may mean controlling several switches in order to remove or turn off the first voltage U1. The several switches may be comprised in the load side portion of the frequency converter as shown in FIG. 1A or in the inverter as shown in FIG. 1B, for instance.

According to an embodiment, the switches may be controlled by a field-oriented or vector control method. Alternatively or in addition, space vector modulation may used for controlling pulse width modulation (PWM) of the switches of the converter 10. In some cases, said turning of the first voltage U1 may mean controlling several switches in co-operation, that is simultaneously or in predefined order. For example, an active vector according to the space vector modulation may have been applied to control the switches. The active vector may be, for example, $V_1=\{1, 0, 0\}$, that is the first upper switch of the converter load side portion is in conductive state while the other two upper switches are in non-conductive state while the second and third bottom switches are in their conductive states. Then the first voltage U1 may be turned off by applying a zero vector, such as $V_0=\{0, 0, 0\}$ or $V_7=\{1, 1, 1\}$ in accordance with the space vector modulation in case of a three-phase two-level converter. It should be noted, however, that said turning off the first voltage U1 does not necessarily mean in all cases simultaneously cutting off the first current I1 as will be explained hereinbelow with respect to FIGS. 4-6.

According to an embodiment, the turning off the first voltage U1 may comprise applying a zero voltage vector in accordance with a vector control method, such as utilizing space vector modulation, for controlling the output 15 of the electrical converter 10. The zero voltage vector may, preferably, have been preceded by an active voltage vector.

In some embodiments, the turning off the first voltage U1, that is step 140, such as by applying a zero voltage vector after an active voltage vector may be utilized to determine the difference between a low impedance fault and, for example, a condition in which currents are flowing due to cable capacitance.

According to some embodiments, the method may comprise, prior to said determining of the first and second current values I1(T1), I1(T2) of the first current I1, turning on the first current I1 by applying the first voltage U1 for a first time period 91, wherein said determining comprises determining of the first and second current values I1(T1), I1(T2) of the first current I1 during the first time period 91.

Alternatively or in addition, the turning on the first current I1 may comprise switching a number of semiconductor switches of the electrical converter 10 by applying for the first time period 91 a first active voltage vector in accordance with a vector control method for controlling the output 15 of the electrical converter 10.

Furthermore, in addition, the method may comprise predefining a length of the first time period 91 to be shorter than a first active voltage vector time threshold, such as 10 microseconds, and only then performing the other method steps. Alternatively, the method may comprise determining the length of the first time period 91 and, if the length is shorter than the first active voltage vector time threshold, such as 10 microseconds, only then performing the other method steps. Thus, the other method steps may, particularly after the predefining or determining of the length, not be performed if the time period 91 of the active vector is longer than the first active voltage vector time threshold. If the period is longer and in case there is a low impedance condition, the converter 10 will trip to overcurrent in many cases.

In various embodiments, the method may comprise determining the first and the second current values I1(T1), I1(T2) with a first sampling rate, wherein the first sampling rate is 0.5-10 microseconds, that is 100 kHz-2 MHz, preferably 0.75-5 microseconds, that is about 200 kHz-1.33 MHz, and more preferably 1 to 2 or to 5 microseconds, that is from 200 kHz or 500 kHz to 1 MHz.

Method execution may be stopped at step 199. The method may be performed continuously, intermittently, or on demand.

According to some particular embodiments, the method may be performed at least or only at the start-up of the converter 10 in order to determine if the operation of the converter 10 is being started against a low impedance condition, such as a short-circuit. The start-up may refer to the first switching period of the converter for providing current to the electrical load L, such as a motor. However, the start-up may alternatively refer to first two, three, four or five switching periods for providing current to the electrical load L. The method may thus be performed in each one of the several periods or in only one of them, such as during the second, the third, the fourth or the fifth period.

Figure 3:
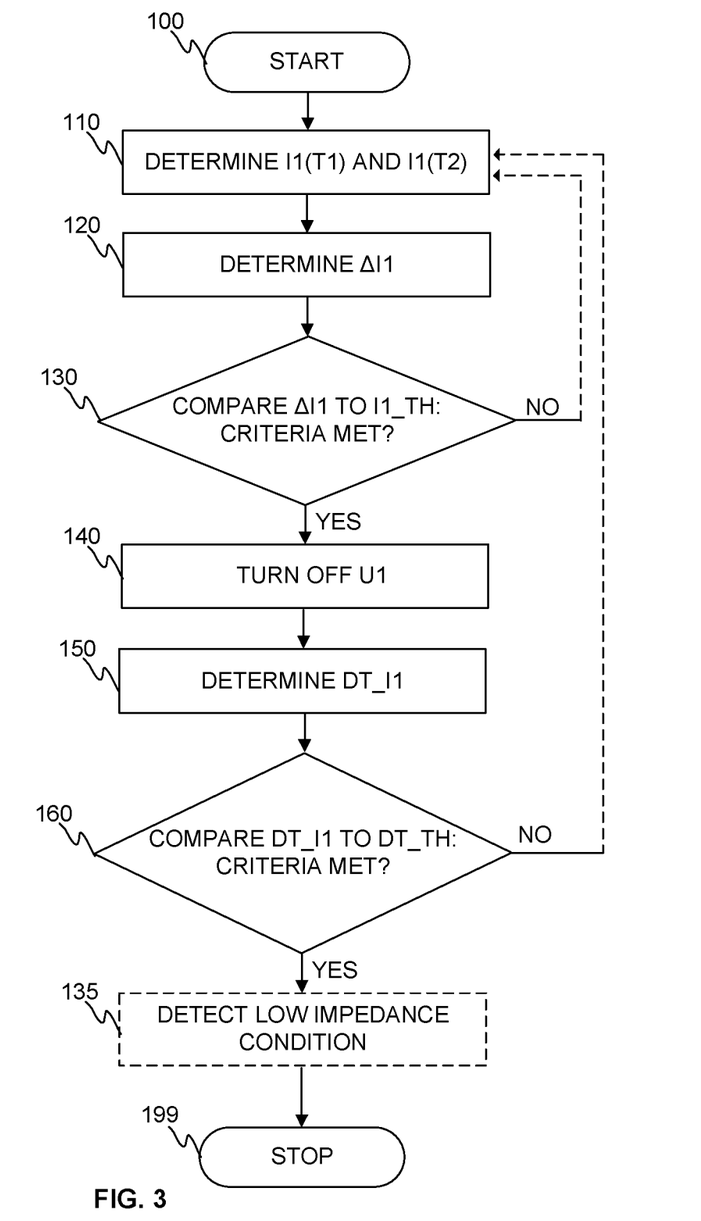
FIG. 3 illustrates a flow diagram of a method according to an embodiment of the present invention.

FIG. 3 illustrates a flow diagram of a method according to an embodiment of the present invention. Steps 100, 110, 120, 130 and 140 may be the same as described in connection with FIG. 2. The position of step 135 may differ.

In various embodiments, the method may comprise, after said comparing the first current difference $\Delta I1$ to the first current difference threshold I1_TH, determining a peak value I1_P of the first current I1, preferably during the first time period 91.

In various embodiments, the method may comprise, after said comparing the first current difference $\Delta I1$ to the first current difference threshold I1_TH, determining a third current value of the first current I1 at a third time instance, and said determining the decay time DT_I1 comprises determining a time interval during which the first current I1 reduces to a predetermined portion of the third current value.

Furthermore, the third current value may be the peak value I1_P of the first current I1. The peak value I1_P may be determined substantially at, or just before, the time instance of turning off the first voltage U1. The peak value may refer to positive or negative peak of the current, that is to a local maximum or minimum value.

Step 150 may refer to determining a decay time DT_I1 of the first current I1. The first current I1 may continue to flow after turning off the first voltage U1, for example, due to energy stored into inductances of the electrical load L, such as of an electrical motor, and/or into elements between the converter 10 and the load L.

In various embodiments, the decay time DT_I1 may be determined as the time it takes for the first current I1 to decay to a value of, for example, 37% or 50%, of the peak value I1_P of the first current I1.

Step 150 may advantageously be performed for analyzing the reason for the high di/dt, that is fast change in the first current I1. The decay time DT_I1 may be used to determine if the high di/dt is due to the cable ringing or if it is due to a short circuit, for instance. If the high di/dt is caused by the cable ringing, the decay time DT_I1 is much shorter than in case it is caused by a low impedance condition, e.g. wrong wiring causing short circuit of, for example, a motor. The short circuit caused by the wrong wiring has a quite high L/R, that is the ratio of inductance to resistance, value so that it may be detected quite easily. Typical values of the L/R ratio may be, however not limited to, at least 30 pH/$\Omega$, or in the range from 30 pH/$\Omega$ up to 10 mH/$\Omega$, or at most 10 mH/$\Omega$. The value may depend, for example, on aspects such as geometry, or material of the cable, and/or frequency of the current. In some cases of the ratio being at least 30 pH/$\Omega$, it becomes easier to distinguish between short circuit and cable ringing conditions compared to cases having the ratio less than 30 pH/$\Omega$.

Step 160 may refer to comparing the decay time DT_I1 to a decay time threshold DT_TH. If the criteria, that is the decay time DT_I1 is of predefined magnitude with respect to the decay time threshold DT_TH, such as higher, is not satisfied, the method may be ended. Alternatively, the method may be repeated by determining new first current values I1(T1), I1(T2) as shown in FIG. 3.

According to an embodiment, the decay time threshold DT_TH may be, for example, 30 microseconds. Alternatively, the decay time threshold DT_TH may be equal to the switching period of the converter 10, such as, being 50, 70, 100 or 200 microseconds, one or two milliseconds, for instance.

In various embodiments, the decay time threshold DT_TH may be predefined based on an estimate according to which the impedance at the output 15 is above 0.5% (that is, the impedance causing 0.5% voltage drop with nominal current and nominal frequency, e.g. 50 Hz) or based on a measurement of the impedance at the output 15 of the converter 10. The estimated or measured impedance enables making an estimate or calculating the value of current change during the decay time period there would be a normal impedance at the output 15 of the converter 10.

However, if the decay time DT_I1 is of predefined magnitude with respect to the decay time threshold DT_TH, such as higher, that is the criteria is met, it may be concluded at optional step 135 that there is a low impedance condition at the output 15 of the converter 10. The consequence of performing step 135 may be to shut down the operation of the converter 10 at least partly, such as by stopping the operation of the semiconductor switches by turning off the modulation.

Method execution may be stopped at step 199. The method may be performed continuously, intermittently, or on demand. The method illustrated in FIG. 3 may also be performed at least or only at the start-up of the converter 10 in order to determine if the operation of the converter 10 is being started against a low impedance condition, as already discussed with respect to FIG. 2.

Furthermore, said determining the decay time DT_I1 may comprise determining a fourth current value of the first current I1 after a second time interval after the third time instance, such as at I1_P, and determining a second current difference between the third current value and the fourth current value, and if the second current difference is of predefined magnitude with respect to a second current difference threshold, detecting the low impedance condition.

In some embodiments, the method may comprise substantially simultaneously performing the method steps as described hereinabove with respect to the first current I1 for a second current I2 and a third current I3, wherein the second current I2 and the third current I3 are a second output phase current and a third output phase current of the electrical converter, respectively, and comparing at least one of the following to corresponding values of other two phases: the first current differences $\Delta I1$ ($\Delta I2$, $\Delta I3$; not shown), the decay times DT_TH (DT_TH2, DT_TH3; not shown).

Thus, the decay time DT_TH may be separately determined for all three phases, for instance, and compared to each other. The converter 10 may be configured, for example, to give warning or to trip if the delay times of the phases differ significantly from each other. The significant difference may be, for example, 10%, 25% or 50% relative to the decay time DT_TH of any one of the phases or, for example, to some average value of the decay times, or relative to some predetermined value. In some embodiments, this function may be separated from the di/dt criteria analysis. In an embodiment, the difference may be analyzed also when di/dt trip criteria is not met.

Figure 4:
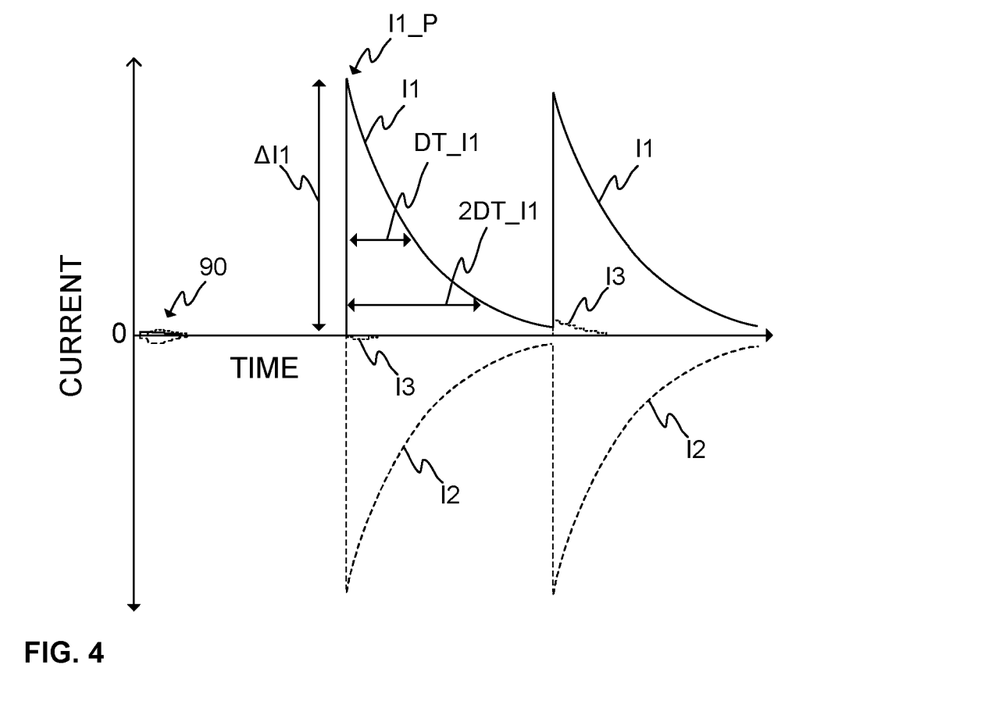
FIG. 4 illustrates schematically currents of an electrical converter according to an embodiment of the present invention.
Figure 5:
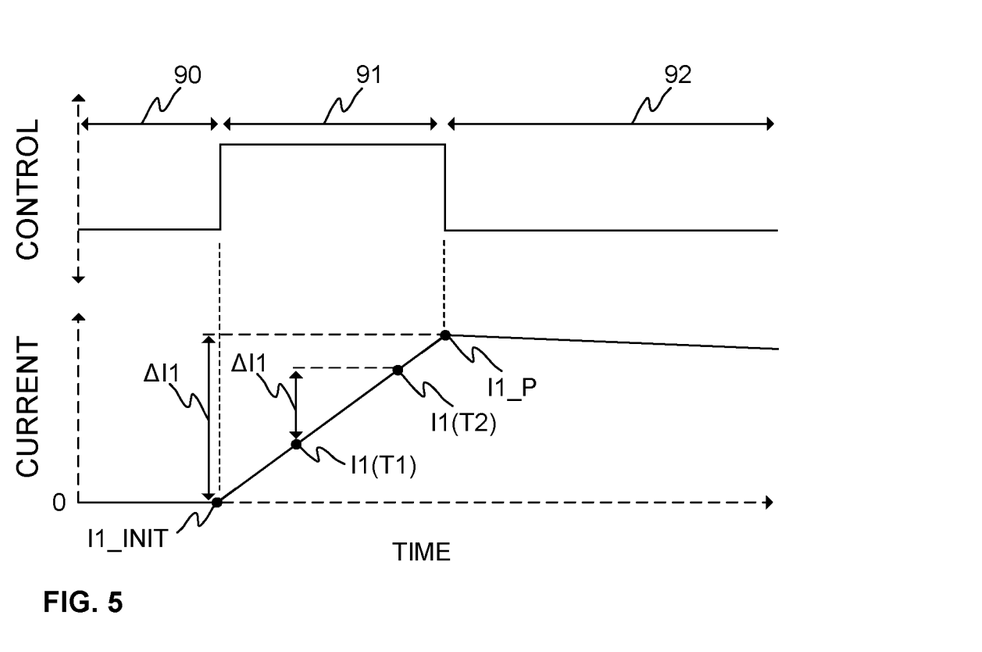
FIG. 5 illustrates schematically current during low impedance condition of an electrical converter in accordance with an embodiment of the present invention.
Figure 6:
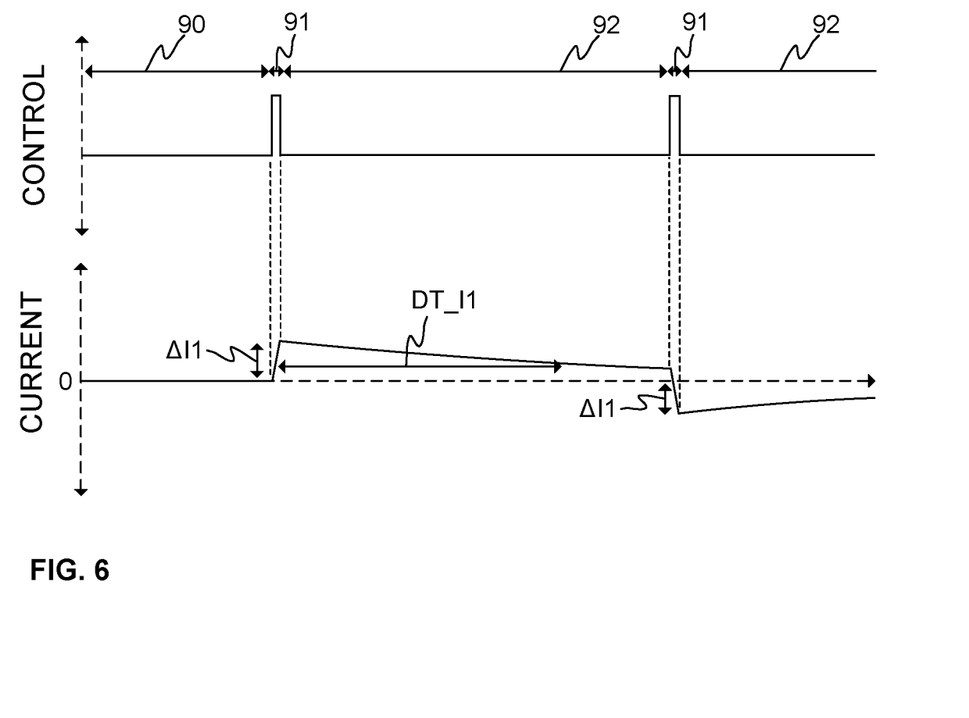
FIG. 6 schematically current during low impedance condition of an electrical converter in accordance with an embodiment of the present invention.

FIGS. 4-6 illustrate situations in which there is a low impedance condition at the output 15 of the converter 10.

FIG. 4 illustrates schematically currents I1, I2, I3 of an electrical converter 10 according to an embodiment of the present invention. The solid line represents the first current I1, preferably the first phase current, the dashed line with longer dashes the second current I2, preferably the second phase current, and the dashed line with short dashes the third current I3, preferably the third phase current of the converter 10 output. The horizontal axis represents time.

As can be seen, right after the origin, at 90, there may be currents I1, I2, I3 flowing for a short time period. These represent currents generated by providing electrical connection between the converter 10 and the electrical load L, in this case an electrical motor being connected to converter 10 by electrical cables. This phenomenon is known as cable ringing and is due to inductances and capacitances in the circuit. Relative to the currents due to low impedance condition, the currents due to the cable ringing decay more quickly into zero. Cable ringing decays normally after three to four periods which may mean, for example, about 12-16 microseconds for a 150 meters long motor cable. The total decay time to zero for a low impedance is much longer because the short circuit impedance typically includes more inductive reactance.

Turning on the first voltage U1 causing the first current I1 to flow occurs at the beginning of the first time period 91 during which the first I1 and second I2 currents, especially, change abruptly. Regarding the first current I1, there is the first current difference ΔI1 between the first and the second current values I1(T1), I1(T2), in this case between the initial value I1_INIT and the peak value I1_P of the first current I1. After turning off the first voltage U1 at the time instance of I1_P, the first current I1 begins to decay. The decay time DT_I1 of the first current I1 may then be determined when the value of the first current I1 has decayed or decreased to about 37% of the peak current I1_P. According to this particular embodiment, the second current I2 acts in similar manner as the short-circuit condition has occurred between the first and second phases. FIG. 4 further illustrates two times the decay time, 2DT_I1, in order to show that the total decay time to zero is much longer than the switching period as 2DT_I1 is shorter than the period between two active voltage vectors (time period between the abrupt changes in the first I1 and the second I2 currents).

FIG. 5 illustrates schematically current I1 during low impedance condition of an electrical converter 10 in accordance with an embodiment of the present invention. FIG. 5 illustrates on the top a control signal being applied to control the operation of the converter 10, and on the bottom the first current I1 with respect to time.

The control signal in FIG. 5 may be divided into several time periods, that is 90, 91, and 92. Time period 90 refers to conditions in which the first current I1 is zero as the converter 10 is still not providing current to the electrical load L. Time period 91, the first time period, refers to condition in which the first voltage U1 has been turned on, for example, by applying an active voltage vector in the control of the operation of the converter 10. During period 91, the first current I1 begins to increase rapidly.

FIG. 5 illustrates the determination of the first I1(T1) and the second I1(T2) current values of the first current I1. According to an alternative embodiment, the initial current value I1_INIT and the peak current value I1_P may be utilized as the first I1(T1) and the second I1(T2) current values, respectively, and thus the first current difference ΔI1 may be determined. Time period 92 refers to conditions in which the first voltage U1 has been turned off, such as by applying a zero voltage vector in the control of the operation of the converter 10. As can be seen in FIG. 5, the first current I1 continues to flow during the time period 92.

FIG. 6 schematically current during low impedance condition of an electrical converter 10 in accordance with an embodiment of the present invention. FIG. 6 illustrates on the top a control signal being applied to control the operation of the converter 10, and on the bottom the first current I1 with respect to time. FIG. 6 illustrates five time periods in the control signal, namely time periods 90, 91, 92, 91, and 92. The first current difference ΔI1 may be determined during any one or in each time period when the first voltage U1 has been turned on. Furthermore, it can be seen that the first current I1 does not decay to zero during one switching period, thus indicating a low impedance condition at the output of the converter 10.

The specific examples provided in the description given above should not be construed as limiting the applicability and/or the interpretation of the appended claims. Lists and groups of examples provided in the description given above are not exhaustive unless otherwise explicitly stated.

What is claimed is:

1. A method for detecting a low impedance condition at an output of an electrical converter, wherein the method comprising:

determining a first current value of a first current and a second current value of the first current, with a first sampling rate, wherein the first sampling rate is 0.5-10 microseconds, that is 100 kHz-2 MHz, and determining a first current difference between the first and the second current values, and comparing the first current difference to a first current difference threshold, and if the first current difference is of a predefined magnitude with respect to the first current difference threshold, turning off a first voltage driving the first current, after said turning off the first voltage, determining a decay time of the first current, and comparing the decay time to a decay time threshold, and if the decay time is of a predefined magnitude with respect to the decay time threshold, detecting the low impedance condition, after said comparing the first current difference to the first current difference threshold, determining a third current value of the first current at a third time instance, and said determining the decay time comprises determining a time interval during which the first current reduces to a predetermined portion of the third current value.

2. The method according to claim 1, wherein said turning off the first voltage comprises applying a zero voltage vector in accordance with a vector control method for controlling the output of the electrical converter.

3. The method according to claim 1, comprising, prior to said determining of the first and second current values of the first current, turning on the first current by applying the first voltage for the first time period, wherein said determining comprises determining of the first and second current values of the first current during the first time period.

4. The method according to claim 3, wherein the turning on the first current comprises switching a number of semiconductor switches of the electrical converter by applying for the first time period a first active voltage vector in accordance with a vector control method for controlling the output of the electrical converter.

5. The method according to claim 3, wherein the method comprises predefining a length of the first time period to be shorter than a first active voltage vector time threshold, and only then performing the other method steps, or, determining the length of the first time period and, if the length is shorter than the first active voltage vector time threshold, only then performing the other method steps.

6. The method according to claim 1, wherein the first sampling rate is 0.75-5 microseconds, that is about 200 kHz-1.33 MHz.

7. The method according to claim 1, comprising, after said comparing the first current difference to the first current difference threshold, determining a peak value of the first current.

8. The method according to claim 1, wherein the third current value is the peak value of the first current.

9. The method according to claim 1, wherein said determining the decay time comprises determining a fourth current value of the first current after a second time interval after the third time instance, and determining a second current difference between the third current value and the fourth current value, and if the second current difference is of a predefined magnitude with respect to a second current difference threshold, detecting the low impedance condition.

10. The method according to claim 1, comprising substantially simultaneously performing the steps of claim 1 for a second current and a third current, wherein the second current and the third current are a second output phase current and a third output phase current of the electrical converter, respectively, and comparing at least one of the following to corresponding values of other two phases: the first current differences, the decay times.

11. The method according to claim 1, comprising performing the method at a start-up of the electrical converter.

12. A control unit comprising:
at least one processor, and
at least one memory storing at least one portion of computer program code,
wherein the at least one processor is configured to cause the control unit to perform at least the method steps according to claim 1.

13. A computer program product wherein it comprises program instructions stored in a computer readable memory, which when executed by a processor of a control unit cause the control unit to perform the method according to claim 1.

14. An electrical converter comprising
a number of output phases,
a number of semiconductor switches configured for producing a corresponding number of output phase currents with respect to the number of output phases,
current determining means for determining the number of output phase currents,
a control unit for controlling an operation of the electrical converter, wherein the control unit is configured to perform the method according to claim 1 and is communicatively connected to said semiconductor switches and said current determining means.

15. The method according to claim 2, comprising, after said turning off the first voltage,
determining a decay time of the first current, and
comparing the decay time to a decay time threshold, and if the decay time is of a predefined magnitude with respect to the decay time threshold,
detecting the low impedance condition.

16. The method according to claim 2, comprising, prior to said determining of the first and second current values of the first current, turning on the first current by applying the first voltage for a first time period, wherein said determining comprises determining of the first and second current values of the first current during the first time period.

17. The method according to claim 4, wherein the method comprises
predefining a length of the first time period to be shorter than a first active voltage vector time threshold, and only then performing the other method steps, or,
determining the length of the first time period and, if the length is shorter than the first active voltage vector time threshold, only then performing the other method steps.

18. The method according to claim 1, wherein turning off a first voltage driving the first current is done by switching off a corresponding switch or switches for applying the first voltage to the output.

19. The method according to claim 1, wherein the first sampling rate is 1-2 microseconds, that is 500 kHz-1 MHz.

20. The method according to claim 1, comprising, after said comparing the first current difference to the first current difference threshold, determining a peak value of the first current during the first time period.

21. The electrical converter of claim 14, wherein the number of output phases comprise first, second and third output phases.

22. A method for detecting a low impedance condition at an output of an electrical converter, wherein the method comprising:
determining a first current value of a first current and a second current value of the first current, and determining a first current difference between the first and the second current values, and
comparing the first current difference to a first current difference threshold, and if the first current difference is of a predefined magnitude with respect to the first current difference threshold,
turning off a first voltage driving the first current,
after said turning off the first voltage,
determining a decay time of the first current, and
comparing the decay time to a decay time threshold, and if the decay time is of a predefined magnitude with respect to the decay time threshold,
detecting the low impedance condition,
after said comparing the first current difference to the first current difference threshold,
determining a third current value of the first current at a third time instance, and said determining the decay time comprises determining a time interval during which the first current reduces to a predetermined portion of the third current value.

23. The method according to claim 22, wherein said turning off the first voltage comprises applying a zero voltage vector in accordance with a vector control method for controlling the output of the electrical converter.

24. An electrical converter comprising
a number of output phases,
a number of semiconductor switches configured for producing a corresponding number of output phase currents with respect to the number of output phases,
current determining means for determining the number of output phase currents,
a control unit for controlling an operation of the electrical converter, and is communicatively connected to said semiconductor switches and said current determining means,
wherein the control unit is configured to perform a method for detecting a low impedance condition at an output of the electrical converter, the method comprising:

determining a first current value of a first current and a second current value of the first current, and determining a first current difference between the first and the second current values, and comparing the first current difference to a first current difference threshold, and if the first current difference is of a predefined magnitude with respect to the first current difference threshold, turning off a first voltage driving the first current, after said turning off the first voltage, determining a decay time of the first current, and comparing the decay time to a decay time threshold, and if the decay time is of a predefined magnitude with respect to the decay time threshold, detecting the low impedance condition, after said comparing the first current difference to the first current difference threshold, determining a third current value of the first current at a third time instance, and said determining the decay time comprises determining a time interval during which the first current reduces to a predetermined portion of the third current value.

* * * * *